United States Patent
Ganesan et al.

(10) Patent No.: US 7,669,155 B2
(45) Date of Patent: Feb. 23, 2010

(54) GENERIC METHODOLOGY TO SUPPORT CHIP LEVEL INTEGRATION OF IP CORE INSTANCE CONSTRAINTS IN INTEGRATED CIRCUITS

(75) Inventors: Balaji Ganesan, Fairview, OR (US); David Vinke, Happy Valley, OR (US); Ekambaram Balaji, Portland, OR (US); Nicholas A. Oleksinski, Northville, MI (US)

(73) Assignee: LSI Corporation, Milpitas, CA (US)

( * ) Notice: Subject to any disclaimer, the term of this patent is extended or adjusted under 35 U.S.C. 154(b) by 318 days.

(21) Appl. No.: 11/728,366

(22) Filed: Mar. 26, 2007

(65) Prior Publication Data
US 2008/0244491 A1 Oct. 2, 2008

(51) Int. Cl.
*G06F 17/50* (2006.01)

(52) U.S. Cl. ............................... 716/6; 716/1

(58) Field of Classification Search .................. 716/1, 716/2, 5, 6, 8–10, 16–18; 703/13, 14
See application file for complete search history.

(56) References Cited

U.S. PATENT DOCUMENTS

| 5,644,498 | A | * | 7/1997 | Joly et al. .................. 716/2 |
| 6,877,139 | B2 | | 4/2005 | Daga ........................ 716/1 |
| 7,475,000 | B2 | * | 1/2009 | Cook et al. ................. 703/14 |
| 2005/0240892 | A1 | * | 10/2005 | Broberg et al. .............. 716/11 |

* cited by examiner

*Primary Examiner*—Vuthe Siek
(74) *Attorney, Agent, or Firm*—William W. Cochran; Cochran Freund & Young LLC

(57) ABSTRACT

A method and apparatus are provided for generating and using timing constraints templates for IP cores that can be instantiated in an integrated circuit design. The templates include a plurality of timing constraint statements for inputs and outputs of the respective IP core. At least one of the statements includes a configurable variable, wherein the timing constraints template is configurable through the variable for each of a plurality of instances of the IP core in the integrated circuit design.

6 Claims, 3 Drawing Sheets

GENERIC METHODOLOGY TO SUPPORT CHIP LEVEL INTEGRATION OF IP CORE INSTANCE CONSTRAINTS IN INTEGRATED CIRCUITS

FIELD OF THE INVENTION

The present disclosure relates to the development and verification of integrated circuit designs, such as custom ASICs. More particularly, the present disclosure relates to generation of timing constraints for design verification.

BACKGROUND

Creation and management of timing constraints has become one of the key factors in achieving timing closure of Application Specific Integrated Circuit (ASIC) designs. Efficient and good quality timing constraints significantly affects Turn Around Time (TAT) for design closure.

The complexity of this problem is due several major reasons. The constraints data is often transformed or modified at various stages of the design process, such as at synthesis, physical implementation and Static Timing Analysis (STA) for sign-off, since the requirements for constraints at each of these stages are different. Also, constraint requirements are fundamentally different for the different Electronic Design Automation (EDA) tools in the flow. Tools come from different vendors and perform different functions. One or more characteristics of the constraints, such as the timing values or the syntax of constraint statements, are therefore modified to better fit the particular stage of development or tool being used. This often requires robust checking and verification against an original set of "golden" constraints data at all stages of the design. The designer therefore requires a consistent set of constraints creation guidelines and methods to achieve good quality constraints that can be verified at each stage to ensure that the constraints used at that stage are valid.

Among these, one of the biggest challenges facing the ASIC designers is the configuration of timing constraints for IP cores and integration of these constraints with chip-level constraints when these IP cores are instantiated in an integrated circuit design.

This disclosure provides a generic and automated methodology to create, configure and integrate IP core instance constraints into the chip-level context using industry standard IP representation formats, for example.

SUMMARY

An embodiment of the disclosure is directed to a timing constraints template for an IP core that can be instantiated in an integrated circuit design. The template includes a plurality of timing constraint statements for inputs and outputs of the IP core. At least one of the statements comprises a configurable variable, wherein the timing constraints template is configurable through the variable for each of a plurality of instances of the IP core in the integrated circuit design.

Another embodiment of the disclosure is directed to a timing constraints database. The database includes a plurality of IP core timing constraints templates. At least one of the templates has a plurality of timing constraint statements for inputs and outputs of the respective IP core. At least one of the statements includes a configurable variable, whereby the timing constraints template is configurable through the variable for each of a plurality of instances of the respective IP core in an integrated circuit design. The database also includes a configurable variable specification comprising metadata, which defines one or more attributes of the configurable variable.

Another embodiment of the disclosure is directed to a method, which includes: selecting an instance of an IP core instantiated in an integrated circuit design; inputting a timing constraints template for the IP core, which comprises a plurality of timing constraint statements for inputs and outputs of the IP core, wherein at least one of the statements comprises a configurable variable; substituting a value for the configurable variable to produce a configured timing constraints template for the instance of the IP core; and generating a set of timing constraints for the instance of the IP core using the configured timing constraints template.

DETAILED DESCRIPTION OF ILLUSTRATIVE EMBODIMENTS

This disclosure provides an example of a generic methodology to enable seamless integration of IP core instance constraints into a set of chip level constraints for integrated circuit designs such as Custom ASIC designs. This methodology is based on standardizing IP core instance constraints based on a template approach that meets both complex IP configurability needs as well as simplifies integration at the chip level.

In an exemplary embodiment, an IP (intellectual property) core generally refers to a large block of logic or data that can be instantiated as a single unit or macro one or more times within an integrated circuit layout definition. IP cores are increasingly being used in ASIC designs to allow repeated use of previously designed components. Examples of IP cores include, but are not limited to input/output (I/O) controllers, Universal Asynchronous Receiver/Transmitter (UARTs), central processing units (CPUs), Ethernet controllers, memory controllers, and peripheral component interconnect (PCI) interfaces.

Examples of IP cores available from LSI Logic Corporation of Milpitas, Calif. include, but are not limited to LSI's CoreWare® IP, which includes serial interfaces, parallel interfaces, memory physical layer interfaces, and processors, for example. Specific examples include, but are not limited to the GigaBlaze® and the HyperPHY® high-speed serializer/deserializer (SerDes) transceiver cores, ARM® and MIPS® processor cores, digital signal processor (DSP) cores, and Universal Serial Bus (USB) cores. These IP cores have complex functions that meet specific standards for design integrity, ease of use and reuse, quality, and support.

IP cores typically fall into one of three categories: hard cores, firm cores, or soft cores. Hard cores are physical manifestations of the IP design. These are less portable and flexible than the other two types of cores. Like the hard cores, firm (sometimes called semi-hard) cores also carry placement data but are configurable to various applications. The most flexible of the three, soft cores exist either as a netlist (a list of the logic gates and associated interconnections making up an integrated circuit) or hardware description language (HDL) code.

Figure 1:
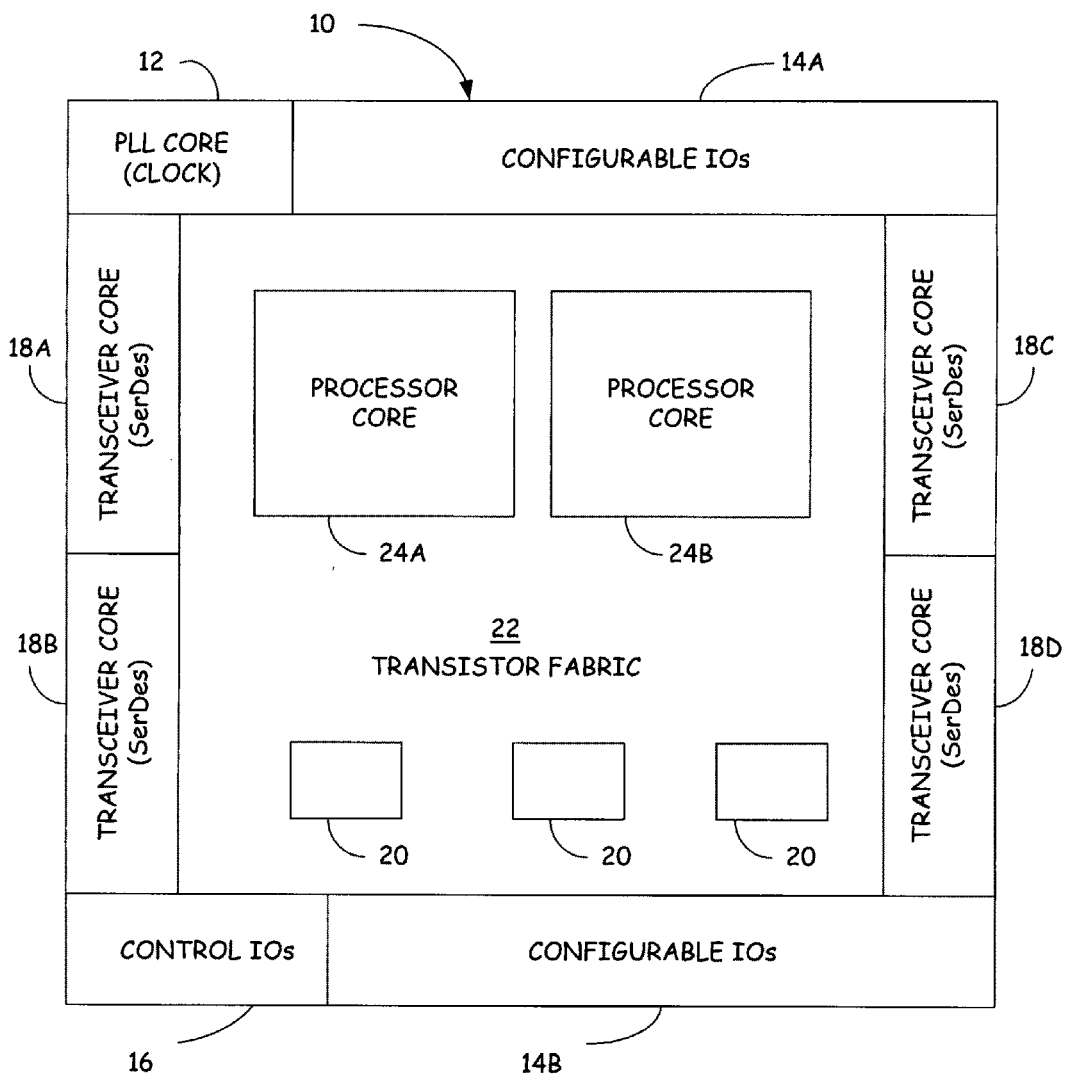
FIG. 1 is a block diagram illustrating a layout pattern of an integrated circuit at a chip-level.

As mentioned above, IP cores can be instantiated one or more times within an integrated circuit layout definition. FIG. 1 is a block diagram illustrating a layout pattern of an integrated circuit 10 at the chip-level. Integrated circuit 10 includes an input-output (IO) ring with a phase-locked loop (PLL) core 12, sets of configurable IOs 14A and 14B, control IOs 16 and transceiver cores 18A-18D. The central area of IC 10 includes a plurality of macros 20, transistor fabric 22 and a processor cores 24A and 24B.

In an exemplary embodiment, cores 12, 18 and 24 include IP cores that are instantiated into the layout definition and netlist of IC 10 at the chip level. One or more of these cores and/or additional cores can be nested and instantiated at other hierarchical levels, such as within other cores on IC 10. Although PLL core 12 may represent a standard PLL core having a predefined layout and placement, in some embodiments or applications of IC 10 the PLL core can be configured to operate at different frequencies or performance levels. Therefore, the timing constraints for PLL core 12 may vary from one chip-level instantiation to the next. Similarly, transceiver cores may represent the same transceiver core type instantiated multiple time or a plurality of types, each being instantiated one or more times. For example, IC 10 might have two GigaBlaze® and two HyperPHY® transceiver cores. Each transceiver core 18 may be configured the same or differently from the other transceiver cores or may have a different function and therefore may have different timing constraints. For example, one transceiver core may be configured for a different transmission frequency or may be configured for test purposes. Similarly, processor cores 24A and 24B may represent the same core type, but can be configured differently from one another.

Since the designer of IC 10 typically does not have a detailed knowledge of an IP core, and the developer of the IP core typically does not have knowledge of how a particular instance of the IP core will be instantiated by the designer, it becomes difficult to create timing constraints for IP cores that can be integrated with other constraints at the chip-level and used with various EDA tools.

Figure 2:
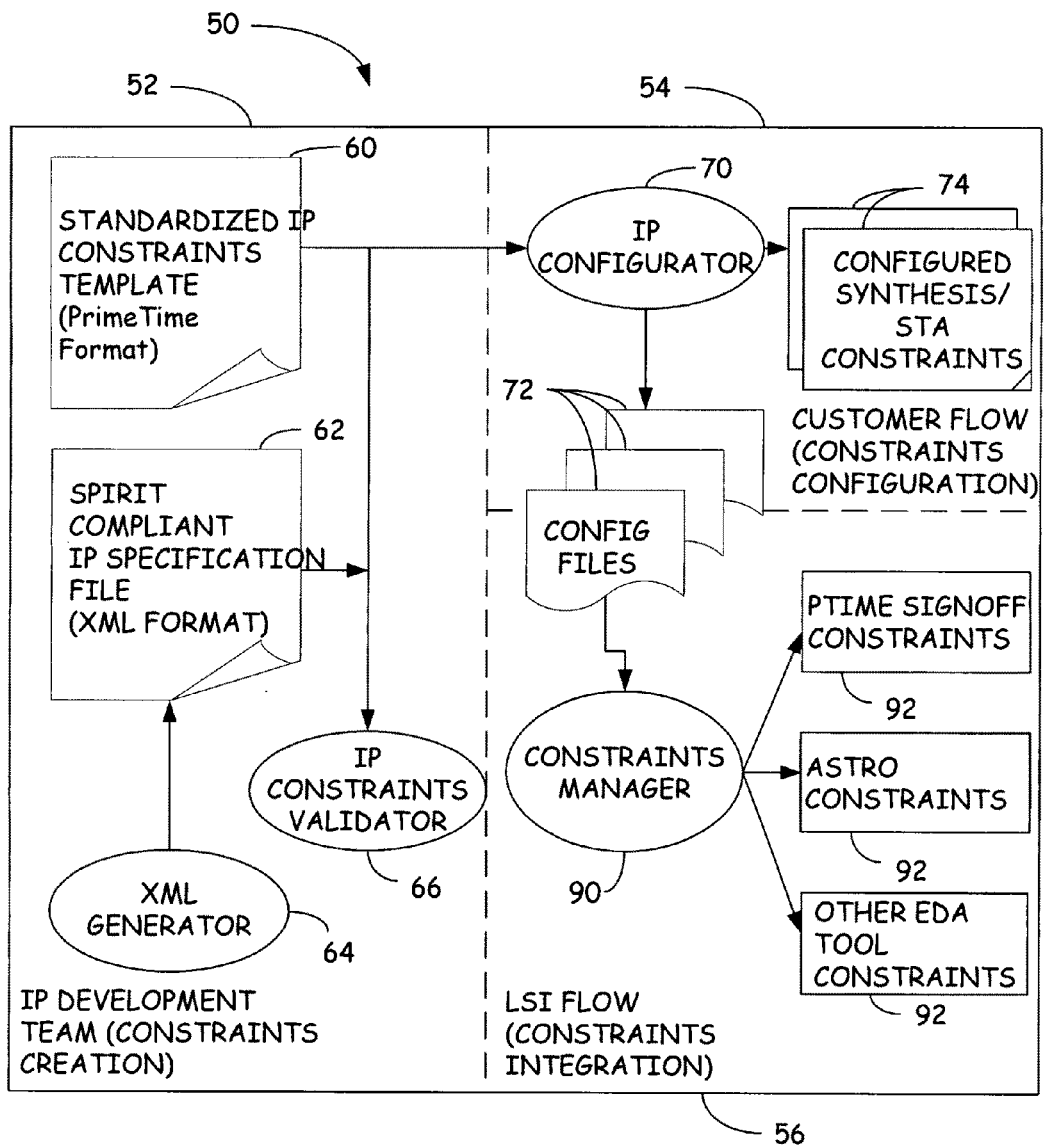
FIG. 2 is a system flow diagram, which illustrates an example of a system and method for generating and using timing constraints for IP cores.

FIG. 2 is a system flow diagram, which illustrates an example of a system 50 and corresponding method for generating and using timing constraints for IP cores. The system and method are generic to different designs and tools and enable seamless integration of IP core constraints into a set of chip level constraints for integrated circuit designs.

The overall flow for IP core constraints creation and consumption is shown in FIG. 1. IP timing constraints are used for various purposes during the development process of a core, as well as in the chip level design flow. A standardized timing constraint template will be used to generate the timing constraints for various development stages such as: Stand-alone static timing analysis (STA) of the core (including all functional and test modes), generation of extracted timing models (ETMs) (e.g., for hard cores), single mode constraints for synthesis, Chip level STA using a flat netlist and Chip level STA using ETMs. An ETM is generally known as an abstraction of an interface behavior of a design, which replaces the original design netlist. The abstraction provides a library cell that contains timing arcs between pins, such as setup, hold and delay values as a function of input transition time and output hold time.

The constraints requirements for each of these stages can be met by creating a standardized timing constraint template, which addresses configurability and integration needs. In one example, the standardized timing constraint template has a format consistent with the PrimeTime® Synopsys Design Constraints (SDC) constraints format from Synopsis, Inc.

In the example shown in FIG. 1, system 50 has three parts; constraints creation 52, constraints configuration 54, and constraints integration 56. In one exemplary embodiment, constraints creation 52 generates a standardized constraints template 60 for each IP core and a corresponding constraints configuration parameter specification file 62. These files can be generated, for example, by the IP core developer, which is typically the foundry company at which IC 10 will be fabricated and which provides the design libraries and databases used by the customer to design IC 10. In one embodiment, the constraints template supports a plurality of timing closure modes and EDA tools and avoids a need to generate separate sets of constraints for each mode or tool.

Constraints configuration 64 is performed by the customer that is designing IC 10. In this part of system 50, the customer customizes the constraints for every instance of each IP core in the design that has configurable parameters.

Constraints integration 56 is performed by the foundry company, which generates a "golden" set of constraints for each of a plurality of IP cores in the design given the particular configuration values provided by the customer. The set of golden constraints are integrated with other chip-level constraints that can be used to verify the final chip design.

Examples of steps performed in each part are described in the various sections below:

A. Constraints Template Creation

The first step in the process is to create a stand alone STA script (such as a Primetime® STA script) to verify the IP core timing. Although the format of constraint template 60 is consistent with the Primetime® SDC format, the constraint template is not limited to SDC, but can include standard Tcl (tool command language) constructs like for loops, conditionals, and variables, along with a limited set of Primetime® constraint type commands. The resulting constraints template therefore supports variations in the usage and configuration of each of a plurality of IP cores instantiated in a particular design.

In order to facilitate multiple usage scenarios the IP constraints template can be organized in the following format, for example:

1. Load, Link, and define timing parameters (PVT, SDF, OCV)
2. Measure PLL REF/FB paths
3. Define configuration variables
4. Do math (clock periods, uncertainties, source latencies, etc.) at the chip-level
5. Create clocks & source latencies
6. Constrain I/Os
7. Create Exceptions
8. Report Timing In the above list, PVT represents variations in process, voltage and temperature, SDF represents a standard delay format, OCV represents on-chip variations, and PLL REF/FB represents the reference input and feedback paths of a phase-locked loop.

Items #4 to #7 represent the timing constraint deliverables (or timing constraint script), and form the basis of what is staged by the IP developer. Items #1, #2, and #8 can be considered as a master script. This master script may source the timing constraint script.

In Item #3, the IP core developer defines the usage dependent variables of each IP core as part of the constraints template for that IP core. For the parameters of the IP core that may change and affect one or more of the IP core constraints depending on the particular usage at the chip level, a variable is created in the template to simplify integration of the IP core constraints at the chip level. Item #3 can be placed in the master script, or ideally in a separate file that is sourced by the master script. This allows an easy method to modify the variables and regenerate.

With the above-organization, the IP core developer can directly run stand alone STA on the core using the master script and timing constraint script.

The next step is to identify all the variables that are needed to create constraints at the chip level. The constraint template needs to be modified from the previous step by incorporating these variables.

The result will be a Primetime® script which can be used to create constraints for chip level integration but still work for stand alone STA. The script will include a combination of variables, SDC statements, and Tcl constructs.

An example IP core constraints template is described in more detail below with reference to Table 3.

B. Generation of a Constraints Configurable Parameter Specification

The IP core developer uses an XML generator 64 to generate a configurable parameter specification 62, which provides a file that defines and documents the configuration variables identified in item #3 of step A in a standard specification format that can be consumed by EDA tools to enable configuration of the constraints.

In one exemplary embodiment, configurable parameter specification 62 complies with the metadata specifications generated by the consortium, "Structure for Packaging, Integrating and Re-using IP within Tool flows" (SPIRIT). The SPIRIT Consortium provides standards to: ensure delivery of compatible IP descriptions from multiple IP vendors; and enable IP interoperability across multiple EDA tools. The SPIRIT Consortium has defined an Extensible Markup Language (XML) based specification to generically represent IP characteristics. The constraints specification 62 is derived based on the SPIRIT XML standard and hence can be leveraged by other EDA tools as well.

The XML specification 62 for the constraints has attributes that are used to configure the constraints including data types, legal ranges, description of the variables and dependencies, etc. These metadata are used to auto-configure the IP constraints. An easy to use XML generator tool 64 provides an interactive user interface to input the configurable parameters, which can be validated for syntax and consistency. The metadata file provides more information about each variable.

The Table 1 lists the attributes and their details for each type of configurable variable that are used in an example of the IP core constraints template.

TABLE 1

| Attribute Name | Description | Legal Value |
| --- | --- | --- |
| ip:name (required) | Name of the configurable variable used in the constraints template | Any name |
| ip:configGroups (required) | Describes which configuration group this variable belongs to. | lsiConstraints Config |
| ip:dependency (optional) | Describes if a variable has any dependency with another configurable variable | Any expression involving another variable |
| lsi:type (optional) | Type of the variable. Normally set to "scalar", but use "array" if the variable represents an array of values. | <scalar \| array> |

TABLE 1-continued

| Attribute Name | Description | Legal Value |
| --- | --- | --- |
| ip:format (required) | Data type of the variable. If the variable should only be set to one of a limited number of values, set this to "choice". | <string \| long \| float \| boolean \| choice> |
| lsi:legalRange (optional) | Describes what the legal values/range that the value of this variable can take. | Comma separated list |
| lsi:help (optional) | Help text to be displayed to the user while prompting the values for the configurable variable. | Any String |

The "lsi" extensions are added to enhance the SPIRIT schema. Apart for IP core specific variables there are certain variable that are required, for example, to be present for all IP cores. These are generic variables that help integration of the IP constraints and the chip level. The following is one such example:

Hierarchy variable—when IP cores are instantiated within customer designs, the hierarchy of the instantiation must be appended to both the netlist and constraint deliverables. For example, one IP core can be nested within another IP core. The constraints used at the chip level should take into account the level at which the IP core is instantiated.

This is design and instance specific, hence it cannot be captured in the deliverables produced by the IP core development team. The solution is to add a variable within the script for the constraint template, which will allow a Constraint Manager tool (used at the chip level) to automate insertion of the hierarchical path name to the constraint deliverables on a per-instance basis.

Following is an example of the variable used in a constraint script:

```
create_generated_clock  -name  {mdcg_clk}  -source  [get_ports
$mdcg_clk_source]         -divide_by    10      [get_pins
{${coreHierarchyPath}uApE110/uEnet/ue110_core/umiim1/
pst_reg_3_0/Q}]
```

This example provides a hierarchical clock name for a clock pin "Q" with an Ethernet IP core instantiated in a design. The symbol $ represents a variable that is changed or replaced to an instance-specific value at the chip level. The variable $mdcg_clk_source represents the source of the clock signal to which pin "Q" of the Ethernet core will be connected. The variable ${coreHierarchyPath} represents a portion of a hiearchical path to pin Q that is replaced at the chip level when the level at which the IP core is instantiated, and thus the complete hierarchical path is known.

There can be different types of parametric variables needed by an IP core to effectively configure the core. Constraints files for configurable cores may need to use several variables in order to support instance specific customization. These variables typically configure the core when instantiated in the top level design. These include variables such as different bus-bit widths, hard macro orientation, clock cycle definition, etc.

Table 2 provides a simplified example of an XML specification defining configurable constraints parameters for an IP core.

TABLE 2

```
-<ip:component xsi:schemaLocation="http://www.mentor.com/
platform_ex/Namespace/IP
http://www.mentor.com/platform_ex/XMLSchema/3.6/component.xsd
http://www.lsilogic.com/Namespace/LSI
http://rm1.lsil.com/XMLSchema/rw40/coreextension.xsd">
    <ip:vendor>LSILogic</ip:vendor>
    <ip:library>CoreWare</ip:library>
    <ip:name>cw000511_1_5</ip:name>
    <ip:version>1.0</ip:version>
    <ip:parameter ip:name="iName" ip:format="hierarchy"
    ip:configGroups="lsiConstraintsConfig" lsi:type="scalar"
    lsi:help="Core (Hardmac) Instance
    Name"> </ip:parameter>
    <ip:parameter ip:name="ipPrefix" ip:format="string"
    ip:configGroups="lsiConstraintsConfig" lsi:type="scalar"
    lsi:help="Unique Clock Name
    Prefix"> </ip:parameter>
    <ip:parameter ip:name="clkMode" ip:format="choice"
    ip:configGroups="lsiConstraintsConfig" lsi:type="scalar"
    lsi:help="Choose Between
    Functional or Test Modes" lsi:legalRange=
    "FUNC,SCAN_SHIFT,SCAN_CAPTURE">
    FUNC </ip:parameter>
    <ip:parameter ip:name="cText" ip:format="choice"
    ip:configGroups="lsiConstraintsConfig"
    lsi:type="scalar" lsi:help="Constraints Context"
    lsi:legalRange="s_alone,flat,etm"> s_alone
    </ip:parameter>
    <ip:parameter ip:name="coreDiv" ip:format="choice"
    ip:configGroups="lsiConstraintsConfig" lsi:type="scalar"
    lsi:help="Divide By Factor"
    lsi:legalRange="1,2,4"> 2 </ip:parameter>
</ip:component>
```

C. Constraints Template Validation

Once the constraints template 62 and the XML constraints parameter specification 64 are created, the constraints template is validated to ensure that the template can be correctly configured for the various parameters. This step can be automated by a constraints template validation tool 66, which: validates the syntactical correctness of the XML constraints parameter specification 66; validates the constraints script for correct Tcl syntax construction; verifies the consistency in the constraint variables with respect to the XML definition; validates the SDC/constraint syntax of the output of the constraint script against a constraint checker.

The constraints validation step ensures that all possible combinations of parameters are applied to the template to generate the constraints and thereby ensures full coverage to the template. This step greatly reduces the risk of IP teams delivering constraints that might be incomplete or incorrect. The validated templates are then staged to an IP core configurator 70 for configuration.

D. IP Constraints Configuration 54

The IP constraints configurator 70 is a tool run by the customer (e.g., chip designer) that customizes the constraints of a plurality of instances of the IP cores used in the design. The IP constraints configurator 70 provides a user interface 80, shown in FIG. 3, where the user can configure the IP core parameters and create constraints configuration files 72 for each of the IP core instances. These configuration files will be used downstream to integrate the IP core constraints at the chip level. Of course, the design could also include IP core instances that are not configurable.

Figure 3:
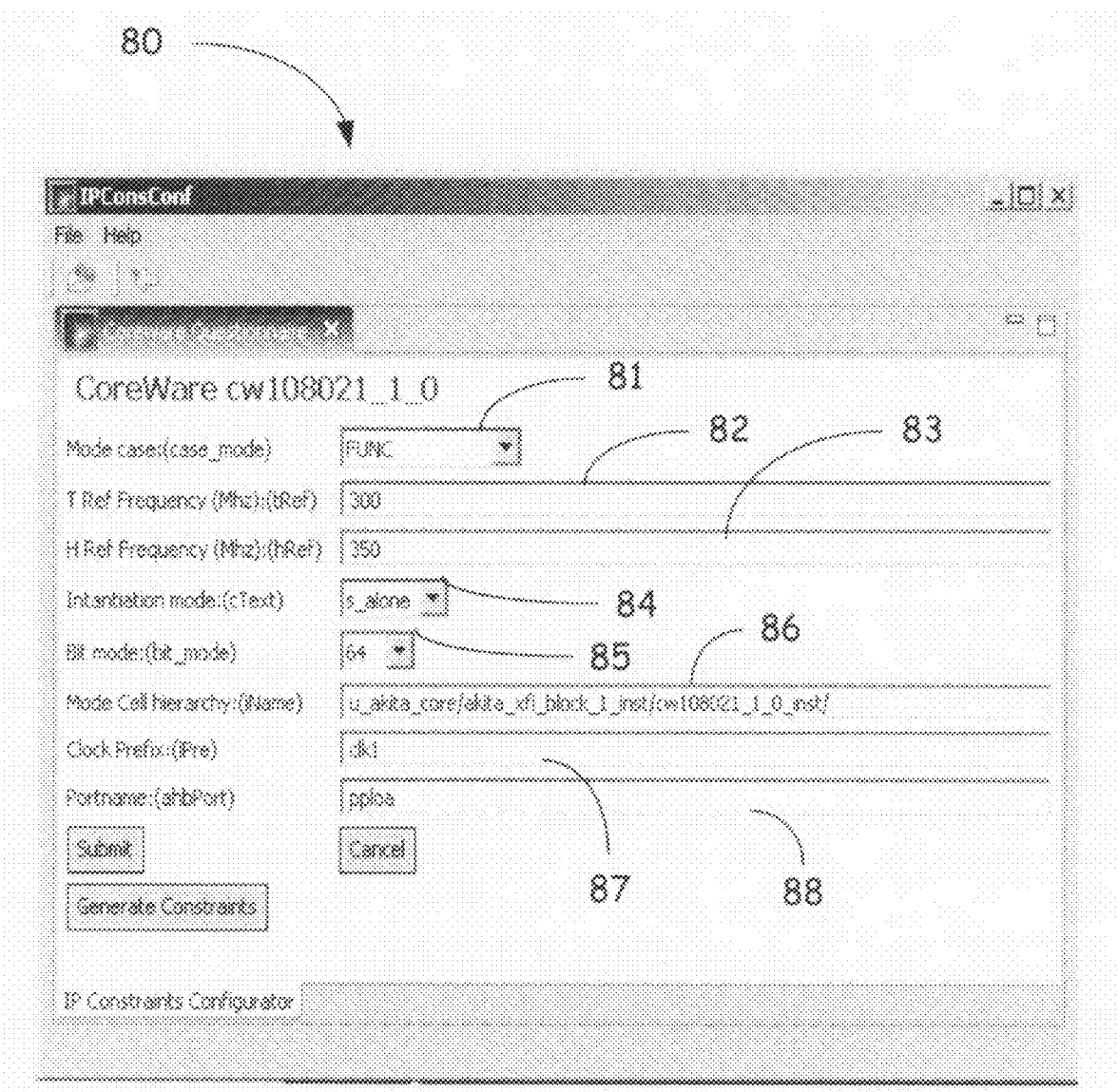
FIG. 3 illustrates an example of a graphical user interface for configuring variables of an IP core constraints template used in the system and method shown in FIG. 2.

The XML constraints parameter specification file contains metadata information for the entire set of parametrical variables, which can be used to dynamically build the user interface shown in FIG. 3 for constraints configuration. The user can configure every instance of the IP cores used in the design dynamically and generate constraints 74 for synthesis and STA quite easily. This configuration information is recorded and can later be used for integration at the chip level.

The IP constraints configurator tool 70 loads the constraints template and the XML constraints specification for the IP core being configured and prompts the user to enter specific values for each configurable variable in the constraints template.

In the example shown in FIG. 3, the user interface 80 displays the variables that can be configured for a particular IP core instance, named cw108021_1_0. These variables were defined in item #3 during the Constraints Template Creation step "A" described above. Through interface 80, the chip designer can define a value for each variable of an IP core instance, which replaces the corresponding variable in the Constraints Template for that IP core.

In this example, mode variable 81 is selected from a pull-down menu and can include values such as FUNC, SCAN_SHIFT and SCAN_CAPTURE to indicate whether the instance will be used in a functional mode or a test mode (e.g., scan testing), for example. Reference frequency variables 82 and 83 allow reference frequencies to be defined for clock speed ranges that will be used with the IP core instance. Variable 84 defines the instantiation mode of the IP core. Selectable options can include s_alone, flat and ETM, for example. Bit mode variable 85 defines the number of bits if a particular core can have multiple bus widths, for example.

Cell mode hierarchy variable 86 allows the chip designer to define the hierarchical path at which the IP core is instantiated, which is substituted for the hierarchy variable. In this example, u_akita_core represents the particular chip in which the IP core is instantiated. The value akita_xfi_block_1_inst represents a module instantiated at the chip level. The value cw108021_1_0_inst represents an instance of the IP core cw108021_1_0 that is instantiated within the module akita_xfi_block_1_inst.

Clock prefix variable 87 allows the chip designer to append a unique prefix to clock names for this instance in order to avoid conflicts with similarly named clocks for other instances of the same IP core in the design. Port name variable 88 allows the chip designer to provide a unique port name for each instance of the IP core. In this example, the port name defines a unique name for each AHB bus port.

Different IP cores may have different variables, and therefore the user interface 80 may be different for each IP core. IP configurator tool 70 reads the XML specification file 62 associated with the IP core and dynamically builds the user interface (e.g., a graphical user interface (GUI)).

In the example shown in FIG. 3, user interface 80 further includes a submit button that is selected when the designer wishes to submit the selected values for storage as a configuration file 72 (shown in FIG. 2) for that IP core instance. A cancel button may be selected to cancel the configuration session without storing entered values for the IP core instance.

When the user selects the generate button, the IP configurator tool 70 generates constraints 74 for the IP core that can be used by the chip designer during various design stages, such as synthesis or STA, using the configured values. In one exemplary embodiment, the constraints output of IP configurator tool 70 has a pure SDC file format without Tcl constructs like loops, variables or conditionals. All variables are replaced with the values defined by the user based on the known use of the IP core.

Table 3 provides a simplified example of an IP core constraints template having a plurality of constraint statements, wherein at least one constraint statement includes a configurable variable that can be configured by the user with IP Configurator tool 70.

TABLE 3

```
if {$clkMode =="FUNC" } {
   if {$cText == "s_alone"} {
      create_clock -name myclock -period 5 -waveform {0 2.5}
[get_ports clkin]
      create_generated_clock -name myclock2 -source [get_ports
clkin] -divide_by ${coreDiv}    [get_pins u_myIP/Q]
   } elseif {$cText == "flat"} {
      #The source clock is created at the toplevel- we use it
here:
      create_generated_clock -name ${ipPrefix}myclock2 -source
${clksrc} -divide_by ${coreDiv}    [get_pins ${iName}u_myIP/Q]
   } elseif {$cText == "etm"} {
      #Clocks are auto. Generated in the ETM (propagated from
toplevel clocks)
   }
} elseif {$clkMode == "SCAN_SHIFT" || $clkMode ==
"SCAN_CAPTURE"} {
   foreach port {LSI_SCAN_CLOCK[0] LSI_SCAN_CLOCK[1]
LSI_SCAN_CLOCK[2]} {
      if {$clkMode == "SCAN_SHIFT"} {
         create_clock -period 10.0 -waveform {0 5.0} [get_ports
$port]
      }
   }
}
```

The above-example provides only a subset of the constraint statements that would be included in a template for a particular IP core labeled "u_myIP". This example includes two types of constraint statements, a create_clock statement and a create_generated_clock statement.

Each $ symbol in the template precedes a variable. The $clkMode configurable variable indicates the mode in which the particular instance of the IP core will be used, and can have the following values: FUNC, SCAN_SHIFT or SCAN_CAPTURE. The customer selects the desired mode, similar to variable 81 in FIG. 3.

The $cText configurable variable indicates the context in which the constraint statements will be run for the particular IP core instance. For example, this variable can be selected as s_alone, flat, or etm, similar to the variable 84 in FIG. 3. If the context is "s_alone", the IP core is treated like a stand-alone chip, and the get_ports and get_pins arguments do not need hierarchical names to indicate the hierarchy on the chip at which the IP core is instantiated. For example, the pin name u_myIP/Q for the Q pin of IP core u_myIP does not need any further hierarchy to sufficiently define the pin.

If the context is "flat", the constraints template does not need a create_clock statement since a clock source will be created somewhere else at the chip level. The create_generate_clock constraint statement has a plurality of configurable variables. The ${ipPrefix} variable is replaced with the unique prefix entered by the customer, similar to variable 87 in FIG. 3. The variable ${clksrc} is replaced with the corresponding clock source generated at the chip level. The ${coreDiv} variable allows the user to define a factor over which the source clock period or frequency gets divided. The ${ipName} variable is a hierarchy variable that is replaced with a hierarchical path name indicating of the hierarchy at which the particular IP core instance is instantiated within the IC design, similar to variable 86 in FIG. 3.

If the context is "etm", an extracted timing model is used, the clocks are automatically generated and no constraint statements are necessary.

If the usage mode is SCAN_SHIFT or SCAN_CAPTURE, then the template creates three clocks, one for each port.

Once configured, the template for each IP core can be used by the IP Configurator tool 70 (such as by selecting the "Generate Constraints" button shown in FIG. 3, to generate a set of constraints for the configured IP core instances. As mentioned above, this constraints data is often transformed or modified, either by the chip designer, the design tools or both, at various stages of the design process, such as at synthesis, physical implementation and STA since the requirements for constraints at each of these stages are different. Also, constraint requirements are fundamentally different for the different EDA tools in the flow. Tools come from different vendors and perform different functions. One or more characteristics of the constraints, such as the timing values or the syntax of constraint statements, are therefore modified to better fit the particular stage of development or tool being used.

Thus, not all of the constraints data within the SDC output file that is used by the chip designer is suitable or reliable for integration at the chip level or for final STA signoff before fabrication.

E. IP Constraints Integration

Step D generates a set of configuration files 72 for each IP core instance in the design based on the configuration values supplied by the customer. These configuration files are input to a Constraints Manager tool 90. Constraints Manager tool 90 uses the original configuration files 72 to recreate a "golden" set of constraints for each IP core instance and integrate the constraints at the chip level to produce a final set of chip level constraints.

The Constraints Manager tool 90 is a timing constraints manager that provides automated solutions for creation, management, transformation and verification of timing constraints in an integrated circuit design flow, such as LSI Logic Corporation's FlexStream® Design flow.

The IP core constraints that are used during synthesis will normally include specific requirements that are not compatible during downstream analysis like STA. Furthermore the customer may add or delete constraints for IP cores during synthesis, which needs to be reconciled during chip level integration. Rather than attempt to modify the IP core constraints that are handed off with the netlist from the customer, the Constraints Manager tool 90 replaces the IP core constraints with the set of "golden" IP core constraints. This golden set is generated automatically from the set of configuration files 72 created by the customer using IP Constraints Configuration (Section D above). This transformation is denoted as a "Gut and Replace" whereby the IP constraints in the chip level customer handoff constraints are replaced with the golden constraints set.

The "gut and replace" includes three basic steps:
1. Identify all IP core constraints in the customer handoff constraints.
2. Generate the "golden" IP core constraints for each IP core instance.
3. Replace customer IP core constraints with golden constraints.

E.1 Identification of IP Core Constraints

The Constraints Manager tool 90 inputs the netlist, the configuration files 72 and the chip level constraints provided by the customer. Given the netlist and the set of chip level constraints, the Constraint Manager tool 90 identifies the constraints that are associated with each IP core instance. This identification may be done in a series of substeps:
 a) Identify all IP core instances in the design;
 b) Generate constraints for each IP core instance;
 c) Identify all clocks associated with each IP core instance;

d) Identify IOs associated with each IP core instance; and e) Identify constraints in the customer chip level SDC constraints file that match the constraints generated in b), or that reference any IP core instance, or reference a clock or IO associated with an IP core instance.

E.1.1 Identifying IP Core Clocks

IP core clocks are any clocks that are defined (by create_clock or create_generated_clock) with a source object that is inside an IP core instance, i.e. the hierarchical name of the object is inside an IP core instance. Clocks defined at a primary input (a port at the boundary of the IP core) can also be considered IP core clocks if they directly connect to an IP core without going through the clock factory. More precisely, any clock defined at a primary input is an IP core clock if tracing from the IO only reaches an IP core, and does not reach any PLL's or other endpoints.

E.1.2 Identifying IP Core IOs

IP core IOs are defined as IOs that directly connect to the IP core, without any gating logic. This includes clock inputs.

E.1.3 Identifying IP Core Constraints

Two types of constraints in the incoming set from the customer SDC file will be identified as IP core constraints. The first type includes constraints that exactly or closely match the matching constraints generated by the Constraints Manager tool 90 previously in step b). The second type includes those that can be associated with a particular IP core instance. The first type can be identified by checking for an exact match with a matching constraint, or by a close match depending on the constraint command as follows (for example):

- create_clock, create_generated_clock: The clock names match. (For example, the constraint statement matches except that the customer might have modified the clock period in the customer's SDC statement)
- set_clock_latency, set_clock_transition, set_clock_uncertainty: The clock objects match.
- set_input_delay, set_output_delay: The IO pins match.
- set_min_delay, set_max_delay: The paths match.
- set_multicycle_path: The paths match.

For the second type, IP core constraints may be identified based on the constraint command as follows (for example):

- create_clock: The source object is an IP core clock, i.e. listed in the pin list.
- create_generated_clock: The source object is an IP core clock, i.e. specified as the -source option, or listed in the pin list.
- set_clock_latency: The clock object is an IP core clock.
- set_clock_transition: The clock object is an IP core clock.
- set_clock_uncertainty: All of the -from, -to, or clock objects are IP core clocks or source clocks for IP core clocks.
- set_propagated_clocks: The clock object is an IP core clock.
- set_input_delay, set_output_delay: None for LSI Logic's MRS resynthesis tool, or IP core IO for STA.
- set_disable_timing: The cell is inside an IP core instance, or the cell is an IP core IO cell.
- set_min_delay, set_max_delay: -from or -to is inside (but not at the boundary) of an IP core instance, or -through is inside or at the boundary of an IP core instance.
- set_false_path, set_multicycle_path: -from or -to is inside (but not at the boundary) an IP core instance, or -through is inside or at the boundary of an IP core instance. Also, if -to are all IP core clocks and -for are all IP core clocks or source clocks for IP core clocks. Here a source clock means, for example, the clock is specified as -source for a create_generated_clock.

E.2 Generation of Golden IP Core Constraints

In this step the "golden" set of IP core constraints are generated by using the configuration files generated in section D. and re-create the constraints set directly from the template. This approach ensures that the real set of IP core constraints get replaced into the chip level context.

E.3 Replacement of Customer IP Core Constraints

This is the final step wherein the actual replacement of customer constraints with the golden set occurs within the customer's set of chip level constraints. The Constraints Manager tool 90 marks the identified customer IP core constraints, which the user can verify and confirm if they can be replaced. For example, the tool can highlight those constraints that are replaced or otherwise deleted so that the user can review and edit through a browser or other GUI interface.

Once the final chip level set of constraints has been created, with all IP core constraints identified and replaced with the golden set, the Constraints Manager tool 90 outputs the set of constraints in an SDC format, for example, which can be used by the Constraints Manager tool and/or one or more additional tools to generate sets of constraints 92 for use with respective target tools. For example, sets of constraints can be generated for PrimeTime® STA sign-off, Astro® UDSM or other EDA tools.

F. Implementation of System 50

In general, the various elements of system 50 shown in FIG. 1 that are executed to implement one or more of the steps described herein are referred to as design tools, whether implemented as part of an operating system or a specific application, database, component, program, object, module or sequence of instructions. The design tools typically comprise one or more instructions or databases that are resident at various times in various memory and storage devices in or associated with a computer, and that, when read and executed by one or more processors in a computer network, cause that computer or computers to perform the instructions and/or process the databases embodying the various aspects of the disclosure. Examples of computer readable media on which such instructions and/or databases can be stored include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links.

G. Results

The generic IP core constraints management methodology described above can be a very efficient way of configuring IP core constraints both when the core is used in the stand-alone mode as well as in the chip level.

A significant reduction of turn-around-time can be achieved by incorporating this approach. Another significant result that can be achieved in one or more applications of this methodology is a vast simplification of the IP core constraints template because of the ability to support configuration through variables. This greatly reduces the IP core developer's effort to support and maintain separate templates for various usage modes.

H. Conclusions

The following are conclusions drawn and benefits realized from this methodology (although not all conclusions or benefits need apply to all embodiments):

1. Improved productivity of IP core support—reduces support overhead of IPPS FCEs, since focus will be on a standard deliverable, as opposed to different documents or standalone scripts;
2. Improved accountability, ownership, standardization and communication of constraints from IPPS to customers templates as opposed to documented constraints or standalone script;
3. Improved quality of deliverables for IP core constraints, since the validation tools can automatically ensure this;
4. Consistent methodology across all IP cores, aligned with chip level integration and constraint methodology, which makes the support for Tools & Methodology easier and more efficient
    This approach along with Constraint Manager enables standard conversion of constraints for specific EDA tools. This reduces burden of IP core Designer to perform this conversion;
5. More consistent and predictable turn-around-times regardless of the type, number, or maturity level of IP core instances;
6. Dramatic improvements in the customer's capability to develop full chip-level constraints with much less assistance from the DC and FCEs;
7. It addresses numerous and consistent customer complaints that IP core constraints are incomplete and integration is poorly documented;
8. A known and consistent constraint development process across all of IPPS saves the IP core developer's time due to increased efficiency from knowing exactly what is expected as a constraint deliverable and knowing that once it is achieved, their work is completed;
9. Once acclimated to this process for internal cores, IPPS can more easily integrate third party cores because they are able to leverage a known good process for constraint development; and/or
10. This ability to consistently implement ASICs with the fast turn-around-times, with high accuracy and quality, and without encumbering customers with needless constraint development overhead.

Although the present disclosure has been described with reference to one or more embodiments, workers skilled in the art will recognize that changes may be made in form and detail without departing from the scope of the disclosure or the appended claims.

What is claimed is:

1. A method comprising:
    selecting an instance of an IP core instantiated in an integrated circuit design, the instance of the IP core representing a block of logic instantiated as a single unit within the integrated circuit represented by the integrated circuit design;
    inputting a timing constraints template for the IP core which comprises a plurality of timing constraint statements for inputs and outputs of the IP core, wherein at least one of the statements comprises a configurable variable;
    substituting a value for the configurable variable to produce a configured timing constraints template for the instance of the IP core;
    generating a set of timing constraints for the instance of the IP core using the configured timing constraints template;
    repeating the steps of selecting, inputting, and substituting for each IP core instance in the integrated circuit design that has a timing constraint template having one or more constraint statements with one or more configurable variables;
    generating a set of chip-level timing constraints for the integrated circuit, which includes, for each IP core instance, the step of generating the set of timing constraints for the instance using the respective configured timing constraints template for each instance, the set of chip-level timing constraints representing at least one timing requirement of at least one input of the IP core instance;
    receiving the set of chip level timing constraints and the configured timing constraints template for each of the IP core instances;
    generating a set of golden timing constraints for each of the IP core instances using the respective configured timing constraints template for each instance;
    identifying timing constraints in the set of chip level timing constraints that are associated with at least one of the IP core instances; and,
    replacing the identified timing constraints with corresponding timing constraints from the sets of golden timing constraints by a computer processor.

2. The method of claim 1 wherein the configurable variable is selected from the group consisting of
    a usage mode variable indicating a functional usage of the IP core instance in the integrated circuit design;
    a reference frequency variable;
    an instantiation mode variable indicating a mode in which the IP core instance is instantiated in the integrated circuit design;
    a bit mode variable indicating a number of bits in a set of the inputs or outputs for the IP core instance;
    a hierarchy variable indicating a hierarchy at which the IP core instance is instantiated within the integrated circuit design;
    a clock prefix variable indicating a unique clock prefix to be associated with one or more of the inputs or outputs for the IP core instance; and
    a port name variable indicating a unique name to be associated with one or more of the inputs or outputs for the IP core instance.

3. The method of claim 1 and further comprising:
    inputting metadata, which defines one or more attributes of the configurable variable;
    producing a graphical user interface based on the metadata, which enables a user to associate the value with the configurable variable; and
    receiving the value from the graphical user interface and performing the step of substituting using the received value.

4. A method of generating a set of chip-level timing constraints, comprising:
    selecting an instance of an IP core instantiated in an integrated circuit design, the instance of the IP core representing a block of logic instantiated as a single unit within the integrated circuit represented by the integrated circuit design;
    receiving a timing constraints template for the IP core that comprises a plurality of timing constraint statements for inputs and outputs of the IP core, wherein at least one of the statements comprises a configurable variable;
    setting a value for the configurable variable to produce a configured timing constraints template for the instance of the IP core;
    generating a set of timing constraints for the instance of the IP core using the configured timing constraints template;
    generating a set of chip-level timing constraints for the integrated circuit, which includes, for the IP core instance, the step of generating the set of timing constraints for the instance using the respective configured timing constraints template for the instance, the set of chip-level timing constraints representing at least one timing requirement of at least one input of the IP core instance;

receiving the set of chip level timing constraints and the configured timing constraints template for the IP core instance;

generating a set of golden timing constraints for the IP core instance using the respective configured timing constraints template for the instance;

identifying timing constraints in the set of chip level timing constraints that are associated with the IP core instance; and, replacing the identified timing constraints with corresponding timing constraints from the set of golden timing constraints by a computer processor.

5. The method of claim 4 wherein the configurable variable is selected from the group consisting of a usage mode variable indicating a functional usage of the IP core instance in the integrated circuit design;

a reference frequency variable;

an instantiation mode variable indicating a mode in which the IP core instance is instantiated in the integrated circuit design;

a bit mode variable indicating a number of bits in a set of the inputs or outputs for the IP core instance;

a hierarchy variable indicating a hierarchy at which the IP core instance is instantiated within the integrated circuit design;

a clock prefix variable indicating a unique clock prefix to be associated with one or more of the inputs or outputs for the IP core instance; and a port name variable indicating a unique name to be associated with one or more of the inputs or outputs for the IP core instance.

6. The method of claim 4 further comprising:

inputting metadata, which defines one or more attributes of the configurable variable;

producing a graphical user interface based on the metadata, which enables a user to associate the value with the configurable variable; and receiving the value from the graphical user interface and performing the step of substituting using the received value.

* * * * *